Dec. 30, 1958 I. WUNDERMAN 2,866,925
TRANSISTOR OPERATED RELAY
Filed Sept. 30, 1955
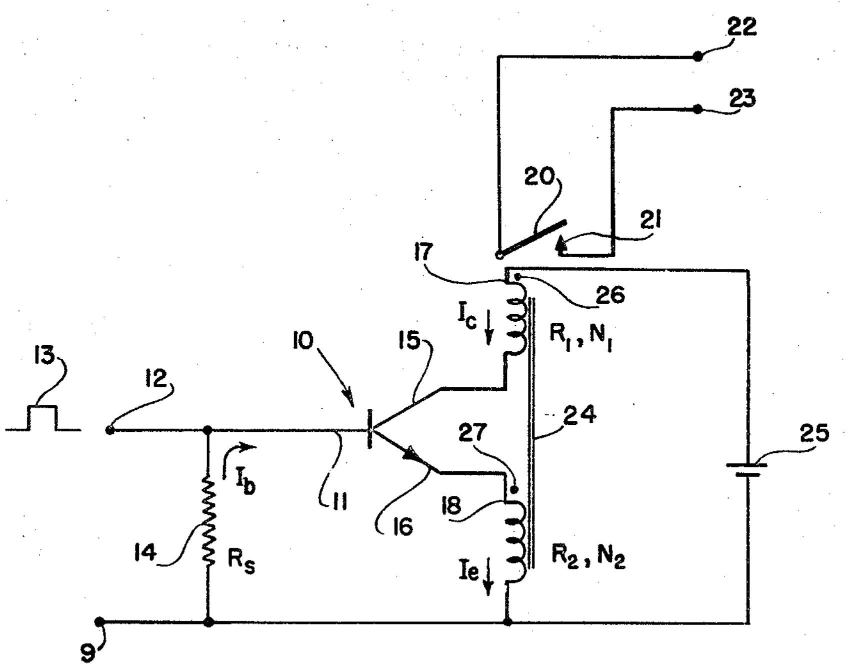
INVENTOR.
IRWIN WUNDERMAN
BY George C. Sullivan
Agent United States Patent Office 2,866,925

Patented Dec. 30, 1958

2,866,925

TRANSISTOR OPERATED RELAY

Irwin Wunderman, Burbank, Calif., assignor to Lockheed Aircraft Corporation, Burbank, Calif.

Application September 30, 1955, Serial No. 537,826

4 Claims. (Cl. 317—148.5)

This invention relates to electrical relays and more particularly to a transistor operated relay of high stability and sensitivity.

In many electrical relay circuits, an amplifier is employed to increase signal current applied thereto so that an inductance may be energized which activates the relay contacts. It is desirable in many applications to attain high sensitivity when minute signals are applied and at the same time to maintain a high level of stability. Employment of a transistor as an amplifier often is used because of its inherent current amplifying characteristics and therefore high sensitivity may be achieved. Relatively minute signals may be impressed on the transistor which are amplified to operate the relay. However, difficulties have been encountered in transistor operated relays which are due in part to the effects of internal temperature on the transistor's operation. It sometimes happens that spurious currents other than the signal current will cause relay operation when not intended because of the transistor's temperature. For example, current conducting through the transistor has a tendency to increase its temperature which in turn causes the transistor to generate additional current generally referred to as leakage current. The total output current rises at an exponential rate and therefore, the relay may energize at times when the input signal would not normally achieve this result. Hence, the operation of the relay may have high sensitivity but relatively low stability.

Thus, it can be seen that means are required to adequately divert leakage current present during transistor operation so that only the applied signal current will operate the relay. In the past both pnp and npn junction transistors have been employed in a variety of circuit arrangements to accomplish stable transistor operation. One arrangement is referred to as a common base circuit in which the relay inductance is connected in the collector circuit. Another arrangement is referred to as a common collector circuit having the relay inductance included in the emitter circuit. These arrangements have been found to have stability at the expense of sensitivity since the leakage current and control current is not sufficiently amplified.

Another circuit arrangement is referred to as a common emitter circuit including the relay inductance in the collector circuit. This circuit has been found unsuitable in many applications because leakage current flowing through the emitter circuit is amplified by the transistor which in turn causes current flow in the collector circuit to rise at an exponential rate which energizes the relay prematurely. To avoid leakage current in the emitter circuit, a resistance sometimes is included in an attempt to divert leakage current through the base circuit. Any desired degree of temperature stabilization is obtained by inceasing or decreasing the value of resistance. However, no effective current amplification is available when a resistance is employed since current dissipation occurs over the resistance instead of the relay inductance. This arrangement has high stability characteristics but low sensitivity.

These difficulties are overcome in the present invention in which a transistor is employed in a different circuit arrangement than the conventional or common collector circuit. The transistor has a portion of the relay inductance in the collector and emitter circuits. A voltage source couples the inductances of the collector and emitter circuits together and is in series with them. Several features reside in a transistor circuit of this construction which include; obviating the need for current dissipative resistors, the reduction of leakage current amplification through the transistor, diversion of leakage current through base circuit, and achieving maximum balance between factors effecting sensitivity and stability. The relay inductance in the emitter circuit provides operational stability by diverting leakage current while the relay inductance in the collector circuit provides operational sensitivity.

It is an object of the present invention to provide a simple, economical and practical transistor operated relay having a minimum number of circuit components.

It is another object of the present invention to provide a transistor operated relay having relatively high sensitivity and stability characteristics.

It is another object of the present invention to adequately divert transistor leakage current so that relay operation is not affected.

It is still another object of the present invention to provide a transistor circuit arrangement having a stability effecting means and a sensitivity effecting means.

These and other objects are shown more clearly in the accompanying figure which is a schematic drawing of a transistor operated relay in accordance with the present invention.

With reference to the arrangement of Figure 1, a npn junction transistor 10 is employed in a circuit which may be considered a hybrid common emitter and common collector configuration. The transistor comprises three elements which are capable of conducting current when activated by a signal input impressed upon its control circuit. As arranged, a base element 11 serves as the control circuit having a pair of terminals 9 and 12 for receiving a D. C. signal input pulse 13. The pulse in combination with a resistor 14 coupled across terminals 9 and 12 places a bias on the base circuit in its low resistance direction so that current flow will be in the direction of $I_b$. Resistor 14 represents the impedance of the control source over which the signal pulse is derived.

A collector element 15 and an emitter element 16 are provided so that current flowing in their respective circuits will energize relay windings 17 and 18. Winding 17 is connected in the collector circuit and should not require a current which will exceed the maximum collector current rating of the transistor. Winding 18 is connected in the emitter circuit and is substantially the same as winding 17 with the possible variation of derived turns ratio and impedance. The combined current represented by the characters $I_c$ and $I_e$ in both circuits is sufficient to energize these windings of the relay and cause electromagnetic forces to move a relay arm 20 into engagement with contact 21. This engagement may be employed to complete another electrical circuit connected to terminals 22 and 23. The core 24 of the windings is composed of magnetic material such as iron for efficient relay operation. Battery 25 serves as a potential source which is employed for establishing polarity differences within the transistor so that current will flow between the elements and also to supply the primary power to energize the relay. The battery is connected in a manner to join the collector circuit and the emitter circuit in series. Dots 26 and 27 represent positive polarity when current is conducted through the windings. The windings are not differentially wound with respect to one another on the relay core. That is, actuating current $I_b$ causes a collector current $I_c$ and an emitter current $I_e$ to flow, such that their ampere turns aid (not subtract) in closing the relay armature. The relative position of the dots 26 and 27 indicate this winding relationship in electronic nomenclature.

During operation windings 17 and 18 mutually augment each other in energizing the relay as $I_e$ and $I_c$ and are simultaneously varied by $I_b$, the transistor input current. The winding resistances represented by the characters $R_1$ and $R_2$, and the number turns, $N_1$ and $N_2$, of the respective windings may be any value required to yield the desired sensitivity and leakage current stability for a particular source impedance. For a given control current $I_b$, the total ampere turns magnetizing the relay core 24 is:

$$\cong\frac{(\alpha N_1+N_2)I_b}{1-\alpha}+\frac{I_c(R_s+R_2)(N_1+N_2)}{R_s(1-\alpha)+R_2}$$

where $\alpha$ represents the conventional transistor short circuit current gain, and $R_s$ represents the control source D. C. resistance of resistor 14.

This circuit arrangement affords a versatile, minimum component, optimum sensitivity and stability configuration. High efficiency is achieved because no dissipative resistors are required to obtain the desired leakage stability.

It should be noted that although a npn type transistor is shown, a pnp type may be employed which would provide similar features. Employment of a pnp type requires that the battery polarities be reversed which would result in current flowing opposite to the direction shown by the arrows in the figure.

Having described only typical forms of the invention, I do not wish to be limited to the specific details herein set forth, but wish to reserve to myself any variations or modifications that may appear to those skilled in the art and fall within the scope of the following claims.

I claim:

1. In a circuit for controlling an electromagnetic device having a pair of inductances, the combination comprising; a current amplifying device having a base circuit, an emitter circuit and a collector circuit; one inductance of the pair connected in the emitter circuit, a resistance connecting the base circuit with the emitter circuit via the inductance in the emitter circuit for deriving a signal current for introduction to the current amplifying device; the other inductance of the pair connected in the collector circuit; both inductances being responsive to current amplification produced by the current amplifying device to operate the electromagnetic device; and a voltage source connecting the inductances of the emitter and collector circuits in an electrical series relationship.

2. In a circuit for controlling an electromagnetic device having a pair of inductances, the combination comprising, a current amplifying device having an emitter, a base and a collector; a resistance connected between the base and emitter via one of the inductances of the pair; an input circuit connected to the base and emitter across the resistance for introducing a signal current to the current amplifying device; an output circuit coupled to the emitter and collector including one inductance of the pair connected to the emitter and the other inductance of the pair connected to the collector; both inductances being responsive to current amplification via the output circuit produced by the current amplifying device to operate the electromagnetic device; and a voltage source connecting the pair of inductances of the emitter and collector respectively in an electrical series relationship for supplying a bias voltage to the current amplifying device and an operating voltage to the pair of inductances.

3. In a circuit for controlling an electromagnetic device having a pair of inductances by means of an applied signal current comprising the combination of; a current amplifying device for amplifying the signal current having a semi-conductive body and a base electrode, an emitter electrode and a collector electrode making contact with the body; the semi-conductive body being susceptible to generate leakage currents responsive to its internal temperature; one inductance of the pair connected to the emitter electrode and the other inductance of the pair connected to the collector electrode; both inductances being responsive to signal current amplification to operate the electromagnetic device; a resistance connected between the base electrode and emitter electrode via the inductance connected to the emitter electrode for deriving the signal current and dissipating leakage current and a voltage source connecting the pair of inductances coupled to the emitter electrode and collector electrode respectively in an electrical series relationship for supplying an operating voltage bias to the current amplifying device and for supplying operating voltage to the pair of inductances.

4. In a circuit for energizing a relay having a pair of inductances actuated in response to an applied signal, the combination comprising; a transistor for amplifying the signal current having a base circuit, an emitter circuit and a collector circuit; the transistor being susceptible to generate leakage currents responsive to its internal temperature which increases while amplifying the signal current; impedance means connecting the base circuit and the emitter circuit via one of the inductances for developing the applied signal; diverting means, including the last mentioned means, for directing the leakage current generated by the transistor through the emitter and base circuits; one inductance of the pair each connected in the emitter circuit and the collector circuit respectively; and a voltage source connecting the inductances of the collector circuit and emitter circuit respectively in an electrical series relationship for supplying an operating voltage bias to the current amplifying device and for supplying operating voltage to the pair of inductances.

References Cited in the file of this patent

UNITED STATES PATENTS

| | | |
|---|---|---|
| 2,579,336 | Rack | Dec. 18, 1951 |
| 2,584,990 | Dimond | Feb. 12, 1952 |